(12) United States Patent
Sato et al.

(10) Patent No.: US 7,358,193 B2
(45) Date of Patent: Apr. 15, 2008

(54) APPARATUS FOR FORMING NANOHOLES AND METHOD FOR FORMING NANOHOLES

(75) Inventors: Junichi Sato, Tokyo (JP); Hajime Amano, Tokyo (JP); Fujimi Kimura, Tokyo (JP)

(73) Assignee: TDK Corporation, Tokyo (JP)

( * ) Notice: Subject to any disclaimer, the term of this patent is extended or adjusted under 35 U.S.C. 154(b) by 185 days.

(21) Appl. No.: 11/002,266

(22) Filed: Dec. 3, 2004

(65) Prior Publication Data
US 2006/0060465 A1   Mar. 23, 2006

(30) Foreign Application Priority Data
Dec. 19, 2003   (JP) .............................. 2003-423359

(51) Int. Cl.
   *H01L 21/302* (2006.01)
(52) U.S. Cl. ...................... 438/706; 438/710
(58) Field of Classification Search ................. 438/706
   See application file for complete search history.

(56) References Cited

U.S. PATENT DOCUMENTS

| | | | | | |
|---|---|---|---|---|---|
| 4,818,359 | A | * | 4/1989 | Jones et al. ............. | 204/298.06 |
| 4,842,683 | A | * | 6/1989 | Cheng et al. ........... | 156/345.37 |
| 5,362,358 | A | * | 11/1994 | Yamagata et al. ...... | 156/345.42 |
| 6,139,713 | A | * | 10/2000 | Masuda et al. ......... | 205/206 |
| 2003/0136766 | A1 | * | 7/2003 | Hoffman et al. ....... | 219/121.43 |
| 2004/0115524 | A1 | * | 6/2004 | Misra et al. ............ | 429/160 |

FOREIGN PATENT DOCUMENTS

JP   05299383 A * 12/1993
JP   2001-305360   10/2001

OTHER PUBLICATIONS dictionary.com; definition of cathode; 2006.*
Martin et al. (A comparitive study of hillock formation in aluminum films; Elsevier; Thin Solid Films 271 (1995) 64-68).*
Shin et al (1996 IOP Publishing).*
Photoelectric effects of nanostructured amorphous carbon films (by Medeiros et al.; Microelectronics journal; vol. 36, Iss. 11, Nov. 2005, pp. 981-984).*
R. C. Furneaux, et al., "The formation of controlled-porosity membranes from anodically oxidized aluminium", NATURE, vol. 337, Jan. 12, 1989, pp. 147-149.
Hideki Masuda, et al., "Photonic Crystal Using Anodic Porous Alumina", Japanese Journal of Applied Physics, vol. 38, 1999, pp. L1403-L1405.
Issei Mizuki, et al., "Green Light-Emitting Device Using $Tb^{3+}$ Activated Anodic $Al_2O_3$ Films Detached Cathodically from Aluminum Substrate", Surface Finishing, vol. 40, No. 12, 1989, pp. 1405-1408.

* cited by examiner

*Primary Examiner*—Duy-Vu N. Deo
*Assistant Examiner*—Patricia A. George
(74) *Attorney, Agent, or Firm*—Oblon, Spivak, McClelland, Maier & Neustadt, P.C.

(57) ABSTRACT

A vacuum chamber includes a plasma generating space in its interior. A magnetic field generating device applies a fluctuating magnetic field to the plasma generating space to cause plasma therein to fluctuate. A substrate is placed in the plasma generating space so that when a potential difference is evoked between a first conductor and a second conductor as a result of the fluctuation of the plasma, the potential difference causes nanoholes to be formed in the substrate.

7 Claims, 4 Drawing Sheets

APPARATUS FOR FORMING NANOHOLES AND METHOD FOR FORMING NANOHOLES

TECHNICAL FIELD

The present invention relates to an apparatus for forming tiny holes (nanoholes) and a method for forming nanoholes.

BACKGROUND OF THE INVENTION

A structure (which will be called a nano-structure hereinafter) having tiny holes called nanoholes on its surface is indispensable in the fabrication of magnetic devices, optical devices and quantum-effect devices.

As known methods for fabricating nano-structures, may be mentioned, in addition to photolithography, electron-beam lithography, X-ray beam lithography, etc., that is, fine patterning techniques utilized in semiconductor processing technologies. There are some additional techniques. For example, Furneaux et al. describe a process for producing a nano-structure provided with anode-acidified alumina nanoholes (R. C. Furneaux, W. R. Rigby & A. P. Davidson, "Nature," 337:147 (1989)). Various applications utilizing anode-acidified alumina nanoholes have been tried, and the nanoholes in question were reported to have an effect similar to that of a photonic crystal (Jpn. J. Appl. Phys., 38:L1403-L1405 (1999)).

An article titled "Green light emitting element with a coat made of electrically etched $Tb_3$+electrically plated anode-acidified $Al_2O_3$" reports a light emitting element based on anode-acidified alumina nanoholes (Surface Technology (Japanese), 40(12):1405 (1989)).

However, conventional anode-acidified alumina nanoholes are formed only on the surface of an Al plate (membrane) which limits the application of the process. Moreover, for an Al membrane to be used as an electrode, it is necessary to remove a barrier layer from the bottom of each nanohole, and, if a process is introduced for removing the barrier layer, that process might disturb the uniformity of nanoholes in their size and shape.

As a solution to the above-described problems, JP, 2001-305360, A discloses a nano-structure having an embossed member attached thereto which is obtained by placing a membrane mainly constituted of Al on an electrode mainly constituted of tin oxide, and subjecting the membrane to anode acidification.

The anode-acidification described in said Japanese Laid-Open Patent Publication has a number of advantages. Since it is based on a wet method, the system therefore will require a low cost. Formation of nanoholes will complete in a short period of time. However, complete removal of solution used in the process left in each nanohole after the process would be difficult, and such solution left in each nanohole, if it were not removed thoroughly, would corrode or degenerate the assembly.

SUMMARY OF THE INVENTION

An object of the present invention is to provide an apparatus capable of forming nanoholes without causing problems such as corrosion, and a method for forming nanoholes.

Another object of the present invention is to provide an apparatus for forming nanoholes which is inexpensive and requires only a brief time for the formation of nanoholes, and a method for forming nanoholes.

Yet another object of the present invention is to provide an apparatus for forming nanoholes whereby it is possible to easily control the diameter and depth of nanoholes, and a method for forming nanoholes.

Yet another object of the present invention is to provide an apparatus capable of forming nanoholes in various materials, and a method for forming nanoholes.

To achieve the above objects, a nanohole punching apparatus according to the invention comprises a vacuum chamber and a magnetic field generating means, and is used for punching nanoholes in a substrate.

The substrate used as a material for the nanohole punching apparatus according to the present invention comprises a first conductor, a second conductor and an insulating structure. The first and second conductors are placed opposite to each with the insulating structure inserted therebetween.

Of the nanohole punching apparatus, the vacuum chamber has a plasma generating space in its interior. The magnetic field generating means applies a fluctuating magnetic field to the plasma generating space to cause plasma there to fluctuate.

Then, a substrate is introduced in the plasma generating space. A potential difference develops between the first and second conductors as a result of plasma fluctuation, which is utilized for the formation of tiny holes in the substrate.

Of the nanohole punching apparatus, the vacuum chamber has a plasma generating space in its interior. Plasma in the plasma generating space under a normal condition, that is, unless it is exposed to an external disturbing agent such as a fluctuating magnetic field, is uniformly dispersed in the space to be at a balanced state.

The apparatus according to the present invention comprises a magnetic field generating means. The magnetic field generating means applies a fluctuating magnetic field to the plasma generating space to cause plasma there to fluctuate. This disturbs the balanced state of plasma, causing the distribution of plasma to be locally distorted.

A substrate on whose surface holes are to be punched is placed in the plasma generating space. The substrate consists of first and second conductors placed opposite to each other with an insulating structure inserted therebetween, of which the first conductor is kept at a reference potential. If the magnetic field generating means causes plasma to fluctuate, and the plasma's distribution in the space becomes locally distorted, a potential difference will result between the first and second conductors. If the potential difference exceeds the maximum tolerable voltage of the insulating structure inserted between the first and second conductors, between the first and second conductors discharge will occur which causes nanoholes to be formed in the insulating structure constituting the substrate.

As described above, according to the nanohole punching apparatus of the present invention and nanohole punching method adaptive for the apparatus, a substrate is placed in the plasma generating space within the vacuum chamber, the magnetic field generating means causes plasma to fluctuate which in turn causes a potential difference to develop between the first and second conductors, and the potential difference is utilized to punch tiny holes in the substrate. Therefore, it is possible by this method and apparatus to form nanoholes in a substrate without exposing the substrate to the risk such as corrosion.

A common membrane forming vacuum machine which is generally used for forming a membrane by sputtering may be applied without any modification as a nanohole punching apparatus according to the present invention, and can form nanoholes in a brief period of time. Therefore, the preparation of an apparatus according to the present invention requires no special facilities, and thus will require only a low cost.

In addition, it is possible to easily control the diameter and depth of nanoholes by appropriately adjusting the pressure within the vacuum chamber, voltage of power source, and interval between the cathode and the substrate.

Since an insulating structure in which nanoholes are to be formed may be made of any material as long as the material comprises an insulating substance, nanoholes can be formed in various materials that satisfy the above requirement.

The magnetic field generating means may comprise a magnet rotating circularly around the vacuum chamber. This construction is commonly observed in conventional membrane forming vacuum machines. Therefore, if such a conventional membrane forming vacuum machine is applied as a nanohole punching apparatus according to the present invention, preparation of additional facilities would be hardly necessary.

The magnetic field generating means may consist of a plurality of electromagnets, and the plurality of electromagnets may be placed around the vacuum chamber so that a rotational magnetic field can be generated round the vacuum chamber.

As described above, to serve as a nanohole punching apparatus according to the present invention, a conventional membrane forming vacuum machine may be introduced. This applied nanohole punching apparatus will work according to the following procedures.

The plasma generating space is filled with an atmosphere consisting of an inert gas such as argon or xenon gas. The vacuum chamber comprises a cathode and a substrate holder. The cathode is placed in the plasma generating space. The substrate holder is placed in the plasma generating space apart from the cathode. A power source is connected to the cathode and substrate holder in such a manner as to place the cathode at a negative potential. A substrate is supported by the substrate holder such that the first conductor comes into contact with the substrate holder. The power source is preferably a radio frequency (RF) power source commonly used in a membrane forming vacuum machine.

The nanohole punching apparatus according to the present invention may further comprise a shutter. The shutter is placed between the cathode and a substrate in the plasma generating space. Under this arrangement, if the distance between the shutter and the cathode is set below a discharge limit, it is possible to punch holes under a desired discharge condition selected by varying the distance between the cathode and the substrate within a dischargeable range.

A preferred embodiment of the substrate may have projections on a surface of the first conductor. If a substrate having such a structural feature is applied to the apparatus according to present invention, discharge occurs from the second conductor towards the projections formed on the surface of the first conductor, and thus it is possible to punch nanoholes nearly exactly at the sites where the projections reside.

As described above, the present invention will ensure following advantages.

(a) It is possible to provide a nanohole punching apparatus capable of forming nanoholes without causing problems such as corrosion, and a method for punching nanoholes.

(b) It is possible to provide a low cost nanohole punching apparatus which can quickly form nanoholes, and a method for punching nanoholes.

(c) It is possible to provide a nanohole punching apparatus whereby it is possible to easily control the diameter and depth of nanoholes, and a method for punching nanoholes.

(d) It is possible to provide a nanohole punching apparatus whereby it is possible to form nanoholes in various materials, and a method for punching nanoholes.

The other objects, constructions and advantages of the present invention will be further detailed below with reference to the attached drawings. However, the attached drawings show only illustrative examples.

DESCRIPTION OF THE PREFERRED EMBODIMENTS

Figure 1:
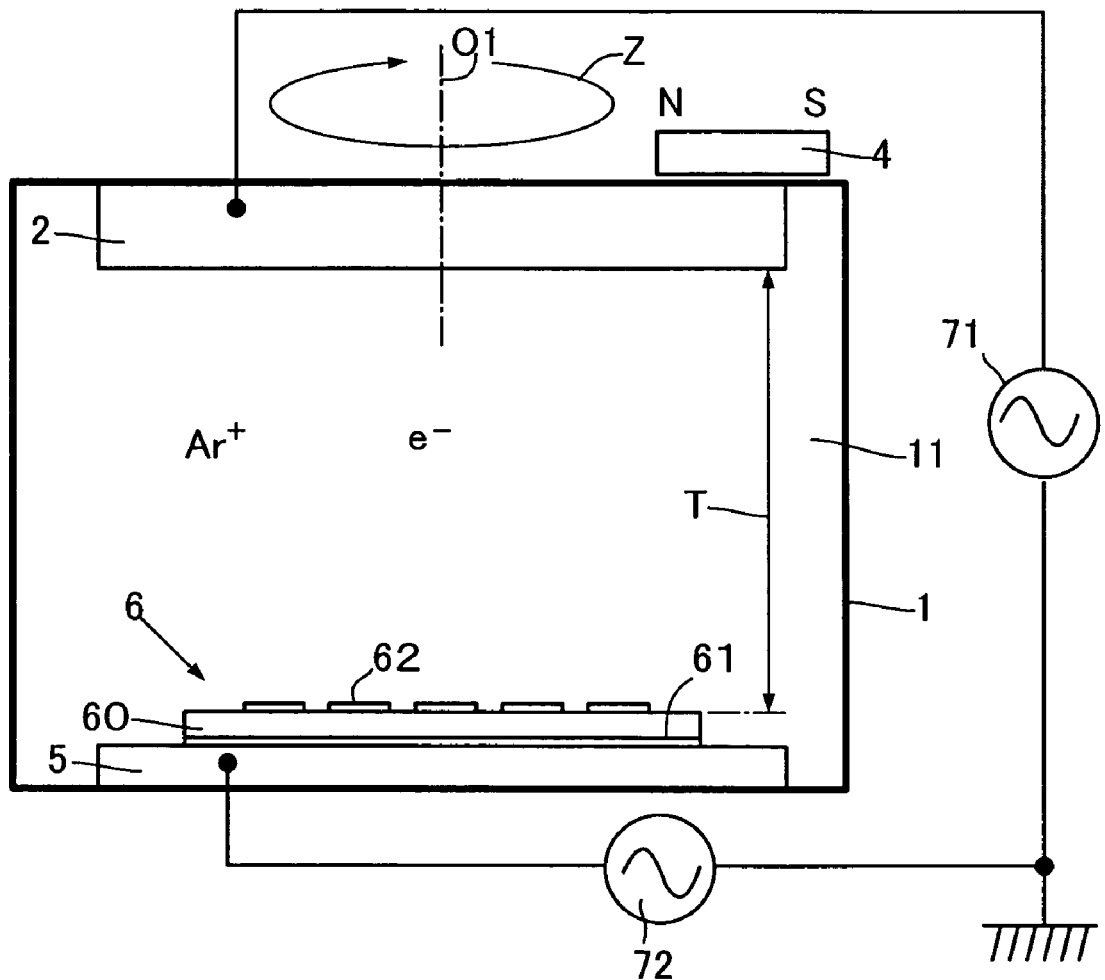
FIG. 1 shows the construction of a nanohole punching apparatus according to the present invention, and a nanohole punching method underlying the operation of the apparatus.

FIG. 1 shows the construction of a nanohole punching apparatus according to the present invention. The nanohole punching apparatus shown in the figure comprises a vacuum chamber 1 and a magnetic field generating means 4.

The nanohole punching apparatus shown in the figure is an application of a common membrane forming vacuum machine. The vacuum chamber 1 comprises, in its interior, a plasma generating space 11 filled with an atmosphere consisting of an inert gas such as argon or xenon gas. Inside the plasma generating space 11, there are placed a cathode 2 and a substrate holder 5. This embodiment will be described on the premise that the inert gas is argon gas. In a common membrane forming vacuum machine, a target is placed on the surface of the cathode 2. However, when the machine is applied as a nanohole punching apparatus according to the present invention, the target is unnecessary and thus is removed.

The substrate holder 5 is placed in the plasma generating space 11 apart from the cathode 2. Voltage is supplied from power sources 71 and 72 between the cathode 2 and substrate holder 5 such that the cathode 2 has a negative potential. The power sources 71 and 72 are radio frequency (RF) power sources commonly used in a common membrane forming vacuum machine. The power source 72 is an RF power source for applying a bias.

A substrate 6 comprises a first conductor 61, second conductor 62 and insulating structure 60. The first conductor 61 and the second conductor 62 are placed opposite to each other with the insulating structure 60 inserted therebetween. The substrate 6 is supported by the substrate holder 5 such that the first conductor 61 comes into contact with the substrate holder 5. The potential V1 of the first conductor 61 is equal to a bias potential of the substrate holder 5, and serves as a reference potential.

In the particular embodiment shown in the figure, as the second conductor 62, a plurality of conductors are provided on a surface of the insulating structure 60. The plurality of conductors may be embedded in the substance of the insulating structure 60. The insulating structure 60 may be made of a single material, or may have a laminated structure comprising a plurality of layers each made of a different insulating material. Conductors may be arranged at the interfaces of a plurality of insulating layers. The insulating structure 60 may comprise any insulating membranes made, for example, of an inorganic insulating material such as alumina, or an organic insulating material. To form nanoholes in an insulating structure 60, it will be convenient to sputter metal materials on the frontal and rear surfaces of the insulating structure 60, thereby forming first conductor 61 and second conductor 62 on both sides of the insulating structure 60. For this purpose, the insulating structure 60 may be preferably made of an inorganic insulating material like the first and second conductors.

The magnetic field generating means 4 applies a fluctuating magnetic field to the plasma generating space 11 to cause plasma there to fluctuate. In the particular embodiment shown in the figure, the magnetic field generating means 4 comprises a magnet which is arranged with respect to the vacuum chamber 1 such that the magnet rotates round the vacuum chamber 1 in a direction as indicated by the arrow Z in the figure. Such arrangement of magnet with respect to the vacuum chamber is commonly observed among conventional membrane forming vacuum machines, and thus does not require any additional special facilities therefore. The magnetic field generating means 4 may comprise a plurality of electromagnets which are arranged circularly around the vacuum chamber 1 such that a rotational magnetic field is generated round the vacuum chamber 1.

Figure 2:
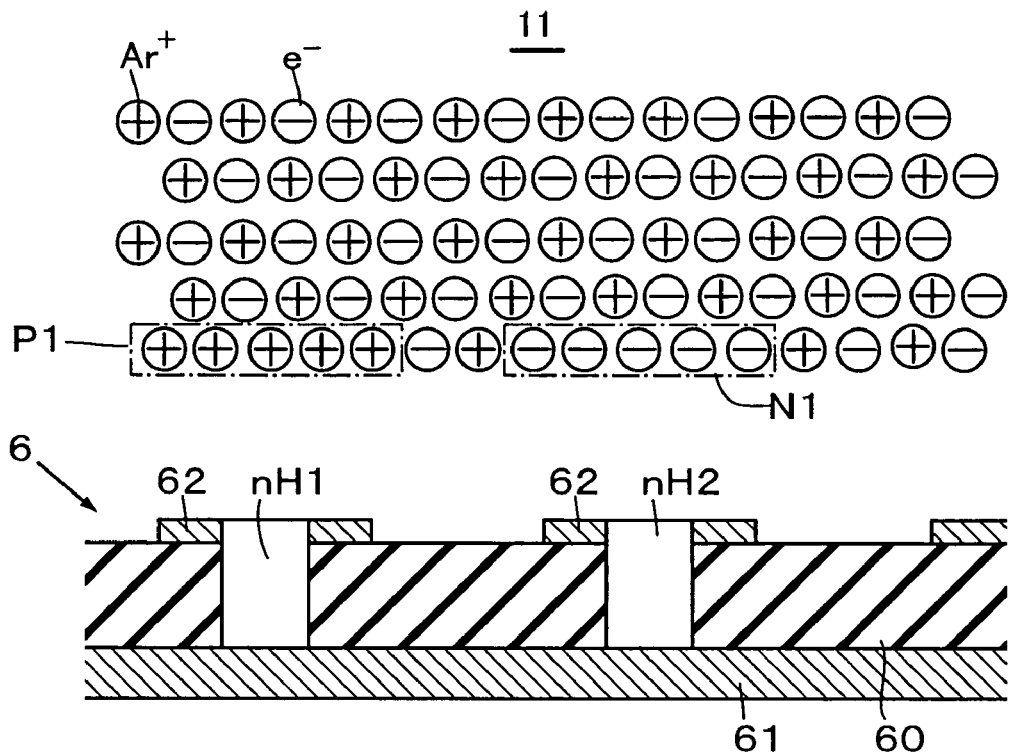
FIG. 2 illustrates hole punching operation due to the nanohole punching apparatus of FIG. 1, and the nanohole punching method underlying the operation of the apparatus.
Figure 2:
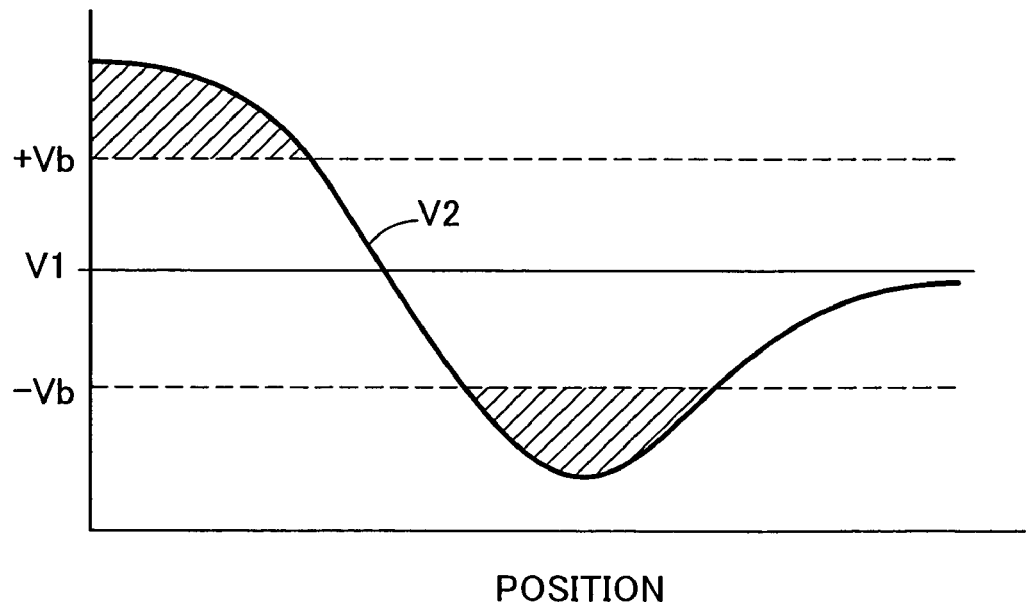

For the above-described nanohole punching apparatus to be able to punch nanoholes on a substrate 6, the substrate 6 is placed in the plasma generating space 11, a first conductor 61 is set to a reference potential, and between the first conductor 61 and the second conductor 62 a potential difference is induced as a result of plasma fluctuation, so that tiny holes can be formed in the substrate 6; Next, processes involved in the above-described operation will be detailed with reference to FIG. 2.

Voltage is applied between the cathode 2 and the substrate holder 5 by RF power sources 71 and 72, to ionize Ar gas existing in the plasma generating space 11 of vacuum chamber 1 to produce plasma therein. If there is no externally applied disturbing agent such as magnetic field, $Ar^+$ ions and electrons $e^-$ generated as a result of the ionization of Ar gas will disperse uniformly in the plasma generating space 11 of vacuum chamber 1, and exist at a well-balanced state.

The apparatus according to the present invention comprises a magnetic field generating means 4. The magnetic field generating means 4 applies a fluctuating magnetic field to the plasma generating space 11 to cause plasma there to fluctuate. This disturbs the balanced state of plasma in the plasma generating space 11, to cause electric charges there to distribute locally unevenly.

For example, there may arise locally unbalanced distribution of electric charges in the plasma generating space 11 as represented by a case where at a place P1 above a second electrode 62 on the left side of substrate 6 (in FIG. 2) $Ar^+$ ions are denser whereas at a place N1 over another second electrode 62 on the right side of substrate 6 electrons $e^-$ are denser. In the plasma generating space 11, there is placed a substrate 6 in which nanoholes are to be formed. The substrate 6 comprises a first conductor 61 and a second conductor 62 placed opposite to each other with an insulating structure 60 inserted therebetween, and the first conductor 61 is kept at a reference potential V1.

Thus, when plasma is fluctuated by means of the magnetic field generating means 4, and its electric charges become locally unevenly distributed, at sites where electric charges exhibit distorted distribution, the potential at the second conductor 62 will increase, and a potential difference V2 occurs between the first conductor 61 and the second conductor 62. If the potential difference V2 increases beyond the maximum tolerable voltage Vb of the insulating structure 60 inserted between the first conductor 61 and the second conductor 62, discharge occurs between the first conductor 61 and the second conductor 62, and nanoholes nH1 and nH2 are formed through the insulating structure 60 and second conductor 62 constituting the substrate 6.

As described above, according to the nanohole punching apparatus of the present invention, a substrate 6 is placed in the plasma generating space 11 within the vacuum chamber 1, the magnetic field generating means 4 is used to fluctuate plasma in the space which is then used to evoke a potential difference V2 between the first conductor 61 and the second conductor 62 of the substrate 6, and the potential difference V2 is used to perforate nanoholes nH1 and nH2 in the substrate 6. Thus, the resulting substrate is free from problems such as corrosion.

A conventionally used membrane forming vacuum machine for forming a membrane by sputtering may be applied without any modification as a nanohole punching apparatus according to the present invention. This applied nanohole punching apparatus allows nanoholes nH1 and nH2 to be formed quickly. It does not require any additional facilities worthy of mentioning, and thus ensures a low cost.

Moreover, it is possible to easily control the diameter and depth of nanoholes nH1 and nH2 by appropriately adjusting the pressure within the vacuum chamber 1, voltage of power supply, and interval between the cathode 2 and the substrate 6.

In addition, the method according to the present invention is effective as long as the structure to be punched is made of an electrically insulating substance. Thus, it is possible according to the method of the present invention to punch nanoholes on various materials.

The present invention will be described in detail based on concrete experimental data.

Figure 3:
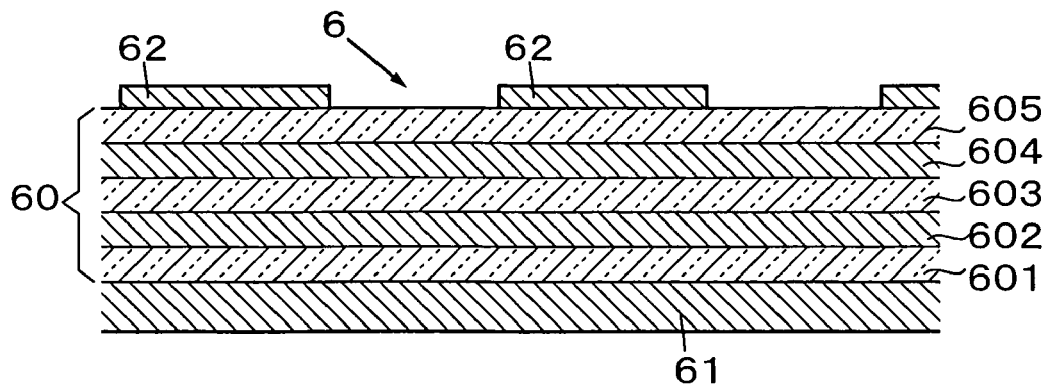
FIG. 3 is a sectional view of a substrate submitted to a nanohole punching experiment for showing its structure.
Figure 4:
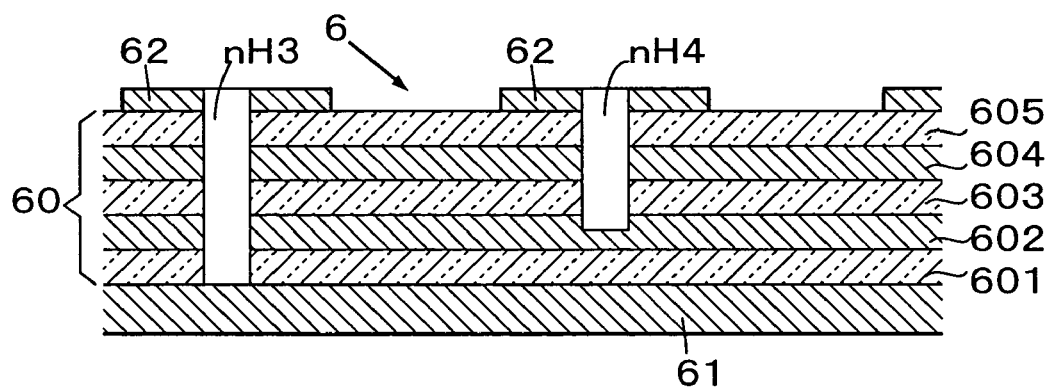
FIG. 4 is a sectional view of the substrate shown in FIG. 3 for schematically showing how nanoholes are punched in the substrate.

A nanohole punching experiment was carried out using a nanohole punching apparatus as shown in FIG. 1. The structure of a substrate used for the experiment is shown in FIG. 3. Of the substrate shown in FIG. 3, a first conductor 61 is a base plate made of alumina-titanium carbide ($Al_2O_3$—TiC base plate) upon which membranes made of following materials are laid one over another: an $Al_2O_3$ membrane 601, NiFe membrane 602, $Al_2O_3$ membrane 603, metal membrane 604, and $Al_2O_3$ membrane 605. On the top of the $Al_2O_3$ membrane 605 is formed a second conductor 62. The nanohole punching conditions and results are shown in Table 1. FIG. 4 shows schematically how nanoholes nH3 and nH4 were formed in the test substrate.

TABLE 1

| Power supply (kW) | 3 | 3 | 3 | 3 |
|---|---|---|---|---|
| Bias voltage (V) | 0 | 0 | 0 | 0 |

TABLE 1-continued

| | | | | |
|---|---|---|---|---|
| Cathode/substrate interval (mm) | 30 | 50 | 70 | 140 |
| Gas pressure (mT) | 2.5 | 2.5 | 2.5 | 2.5 |
| Diameter of hole (nm) | no discharge | 350 | 200 | 80 |
| Depth of hole (nm) | no discharge | 800 | 500 | 400 |

As described in Table 1, when power 3 (kW) was supplied between the cathode and the substrate kept at an interval of 30 (mm) under a gas pressure of 2.5 (mT), no discharge occurred and thus no nanoholes were formed. However, when power 3 (kW) was supplied while the gas pressure was kept at 2.5 (mT), and the interval between the cathode and the substrate was varied to 50, 70 and 140 (mm), discharge occurred and nanoholes as represented by nH3 and nH4 (see FIG. 4) were formed. The diameter of nanoholes varied as a function of the interval between the cathode and the substrate: 350 (nm) for the interval of 50 (mm), 200 (nm) for 70 (mm), and 80 (nm) for 140 (mm). Thus, it is possible to obtain nanoholes whose diameter is increasingly reduced by increasing the interval between the cathode and the substrate.

With regard to the depth of nanoholes, it was 800 (nm) when the cathode-substrate interval was 50 (mm), 500 (nm) for 70 (mm), and 400 (nm) for 140 (mm). Namely, it is possible to obtain nanoholes whose depth is increasingly reduced by increasing the interval between the cathode and the substrate.

Figure 5:
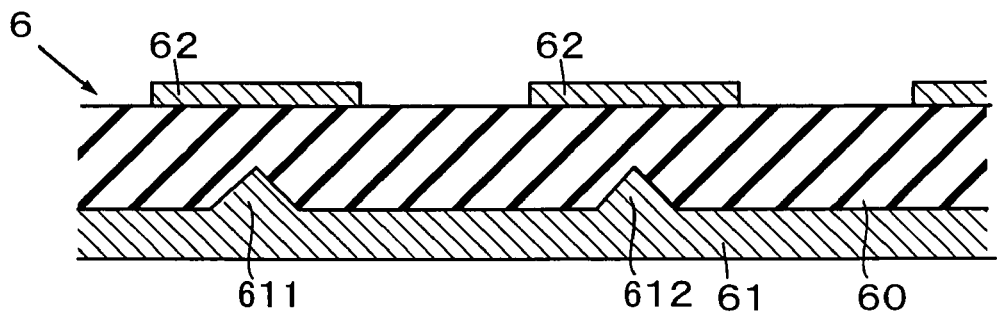
FIG. 5 is a sectional view of another substrate to have holes punched therein.

FIG. 5 is a sectional view of another exemplary substrate. The substrate 6 shown in the figure comprises a first conductor 61 which has projections 611, 612 on one surface. If the substrate 6 having a structure as described above is applied to the nanohole punching apparatus according to the present invention, currents flow from a second conductor 62 towards the projections 611, 612 of the first conductor 61 to effect discharges, and thus it is possible to form nanoholes nearly exactly at the sites where the projections 611, 612 resided.

Figure 6:
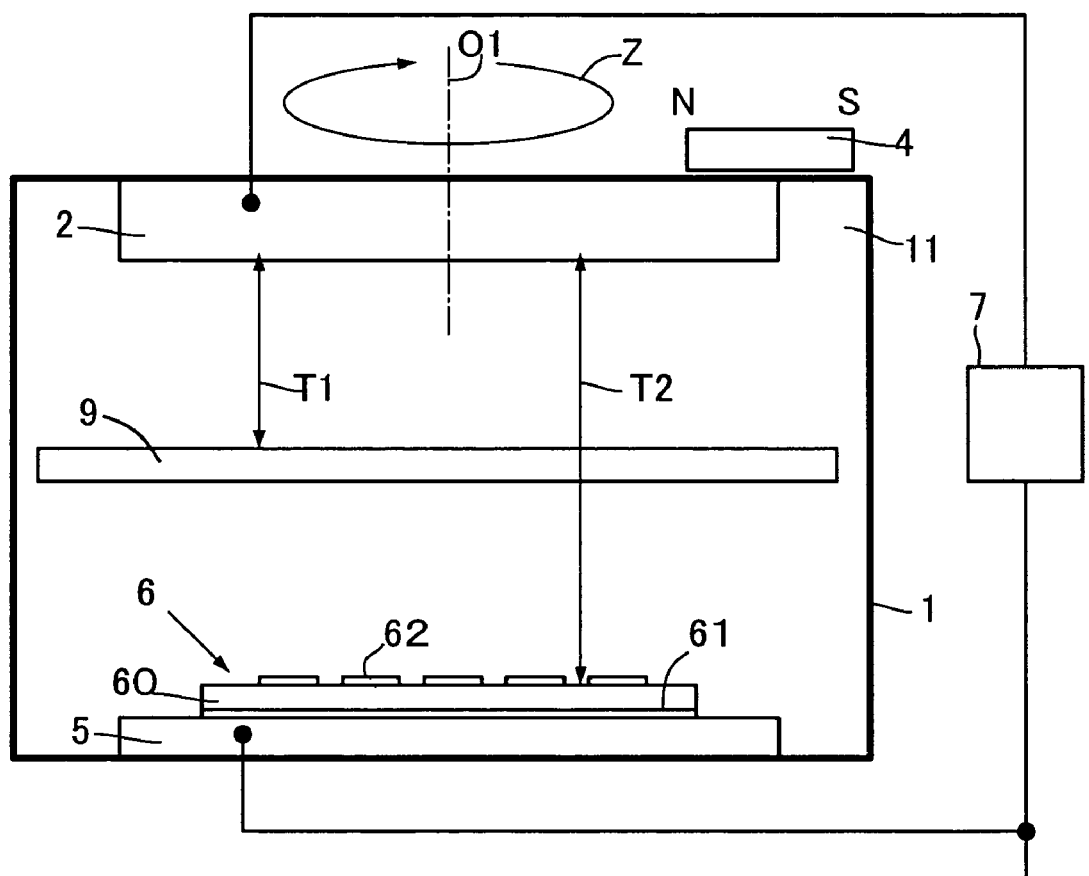
FIG. 6 shows another embodiment of the nanohole punching apparatus according to the present invention.

FIG. 6 shows another embodiment of the nanohole punching apparatus according to the present invention. The nanohole punching apparatus shown in the figure comprises a shutter 9. The shutter 9 is placed between a cathode 2 and a substrate 6 in a plasma generating space 11. According to the nanohole punching apparatus constructed as above, it is possible to form nanoholes in a substrate under a desired discharge condition by adjusting the distance T1 between the shutter and the cathode 2 below a discharge limit, and by varying the distance T2 between the cathode 2 and the substrate 6 within a dischargeable range. If punching of nanoholes is discontinued, the shutter 9 may be withdrawn from a space between the cathode 2 and the substrate 6.

The present invention has been described in detail above with reference to preferred embodiments. However, obviously those skilled in the art could easily devise various modifications of the invention based on the technical concepts underlying the invention and teachings disclosed herein.

What is claimed is:

1. A nanohole-punching method for forming nanoholes as a result of a controlled process in a substrate including a first conductor, a second conductor, and an insulating structure inserted between the first and second conductors, the method comprising:
preparing a vacuum chamber having a plasma generating space in its interior;
placing the substrate in the plasma generating space;
applying a fluctuating magnetic field to the plasma generating space to cause plasma therein to fluctuate and to cause electric charges therein to distribute locally unevenly such that a potential difference is evoked between the first conductor and the second conductor as a result of the fluctuation of the plasma and the locally unevenly distributed electric charges, and the potential difference causes nanoholes to be formed in the substrate.

2. The nanohole-punching method according to claim 1 wherein the applying causes a magnet to rotate circularly around the vacuum chamber.

3. The nanohole-punching method according to claim 1 wherein the applying causes a plurality of electromagnets placed around the vacuum chamber to evoke a rotational magnetic field around the vacuum chamber.

4. The nanohole-punching method according to claim 1 wherein:
the plasma generating space is filled with an atmosphere comprising an inert gas;
the vacuum chamber comprises a cathode and a substrate holder;
the cathode is placed in the plasma generating space;
the substrate holder is placed in the plasma generating space apart from the cathode; and
a power source is connected to the cathode and substrate holder to cause the cathode to take a negative potential.

5. The nanohole-punching method according to claim 4 wherein the power source is a radio frequency power source.

6. The nanohole-punching method according to claim 4 further comprising:
placing a shutter between the cathode and the substrate in the plasma generating place when nanohole-punching is discontinued.

7. The nanohole-punching method according to claim 1 wherein the first conductor includes projections on a surface opposite to the surface where the nanoholes are formed.

* * * * *